: US 10,784,228 B2
(45) Date of Patent: Sep. 22, 2020

(54) METHOD OF MANUFACTURING SEMICONDUCTOR PACKAGE USING SIDE MOLDING

(71) Applicant: LBSEMICON CO., LTD., Gyeonggi-do (KR)

(72) Inventors: Do Hyung Kim, Gyeonggi-do (KR); Sang Hoon An, Gyeonggi-do (KR)

(73) Assignee: LBSEMICON CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/211,421

(22) Filed: Dec. 6, 2018

(65) Prior Publication Data

US 2019/0172814 A1 Jun. 6, 2019

(30) Foreign Application Priority Data

Dec. 6, 2017 (KR) .......................... 10-2017-0166932

(51) Int. Cl.
| | |
|---|---|
| *H01L 23/00* | (2006.01) |
| *H01L 21/56* | (2006.01) |
| *H01L 21/78* | (2006.01) |
| *H01L 21/304* | (2006.01) |

(52) U.S. Cl.
CPC ............ *H01L 24/94* (2013.01); *H01L 21/304* (2013.01); *H01L 21/565* (2013.01); *H01L 21/78* (2013.01); *H01L 24/05* (2013.01); *H01L 24/11* (2013.01); *H01L 24/13* (2013.01); *H01L 2224/0401* (2013.01); *H01L 2224/0508* (2013.01); *H01L 2224/13026* (2013.01)

(58) Field of Classification Search
CPC ......... H01L 24/94; H01L 21/78; H01L 24/13; H01L 21/304; H01L 21/565
See application file for complete search history.

(56) References Cited

U.S. PATENT DOCUMENTS

| | | | |
|---|---|---|---|
| 2010/0096730 A1* | 4/2010 | Stacey | .................... H01L 21/78 257/620 |
| 2012/0119354 A1 | 5/2012 | Tsai | |
| 2015/0130055 A1* | 5/2015 | Lin | .................. H01L 23/49827 257/737 |
| 2019/0081021 A1* | 3/2019 | Sekiya | .................... H01L 24/83 |

FOREIGN PATENT DOCUMENTS

| | | |
|---|---|---|
| JP | 2000068401 | 12/2018 |
| KR | 1020070077686 | 7/2007 |
| KR | 1020090052522 A | 5/2009 |
| KR | 1020170115840 A | 10/2017 |
| KR | 1020170115950 A | 10/2017 |

* cited by examiner

*Primary Examiner* — Changhyun Yi
(74) *Attorney, Agent, or Firm* — Stuart H. Mayer; Mayer & Williams PC (57) ABSTRACT

Provided is a method of manufacturing a semiconductor package, the method including forming sawing grooves by sawing a wafer along individual chip boundaries in a downward direction from a top surface of the wafer by a thickness less than a wafer thickness, filling the sawing grooves with a molding material, forming a redistribution pattern, a passivation pattern, and an under bump metal (UBM) pattern on the wafer, bonding solder balls onto the UBM pattern, thinning the wafer based on a backgrinding process, and dividing the wafer into individual chips by sawing the molding material filled in the sawing grooves, in a downward direction.

14 Claims, 12 Drawing Sheets

METHOD OF MANUFACTURING SEMICONDUCTOR PACKAGE USING SIDE MOLDING

CROSS-REFERENCE TO RELATED PATENT APPLICATION

This application claims the benefit of Korean Patent Application No. 10-2017-0166932, filed on Dec. 6, 2017, in the Korean Intellectual Property Office, the disclosure of which is incorporated herein in its entirety by reference.

BACKGROUND

1. Field

The present invention relates to a method of manufacturing a semiconductor package and, more particularly, to a method of manufacturing a wafer-level chip scale package.

2. Description of the Related Art

Currently, the goal of the electronic industry is to manufacture light, compact, high-speed, multi-functional, high-performance, and high-reliability products at low costs. One of main technologies capable of enabling setup of such a goal in product designing is packaging technology, and one of currently developed packages is a chip scale package (CSP). The chip scale package is a small semiconductor package having a size of a semiconductor chip. However, although the chip scale package is absolutely advantageous in size, the chip scale package still has various disadvantages compared to existing plastic packages. One is low reliability, and another is low price competitiveness due to additional manufacturing equipment, high consumption of raw and subsidiary materials, and high manufacturing costs. To solve the above problems, a wafer-level chip scale package is proposed. That is, a general wafer manufacturing process is performed to manufacture a semiconductor wafer, the semiconductor wafer is divided into individual chips, and then a package assembly process is performed. Although the package assembly process is totally different from the wafer manufacturing process and thus different equipments and raw and subsidiary materials are required, packages may be manufactured as complete products in a wafer level, that is, before being divided into individual chips. In addition, existing wafer manufacturing equipment and processes may be used as package manufacturing equipment and processes. This also means that raw and subsidiary materials additionally required to manufacture packages may be minimized.

A related art includes Korean Application Publication 10-2007-0077686 published on Jul. 27, 2007 and entitled "Wafer Level Chip Scale Package (WLCSP) comprising bumppad of NSMD type and manufacturing method thereof".

SUMMARY

The present invention provides a method of manufacturing a semiconductor package, the method being capable of preventing side wall cracks of a chip in a sawing process of a wafer-level chip scale package. However, the scope of the present invention is not limited thereto.

According to an aspect of the present invention, there is provided a method of manufacturing a semiconductor package, the method including forming sawing grooves by sawing a wafer along individual chip boundaries in a downward direction from a top surface of the wafer by a thickness less than a wafer thickness, filling the sawing grooves with a molding material, forming a redistribution pattern, a passivation pattern, and an under bump metal (UBM) pattern on the wafer, bonding solder balls onto the UBM pattern, thinning the wafer based on a backgrinding process, and dividing the wafer into individual chips by sawing the molding material filled in the sawing grooves, in a downward direction.

According to another aspect of the present invention, there is provided a method of manufacturing a semiconductor package, the method including forming a redistribution pattern, a passivation pattern, and an under bump metal (UBM) pattern on the wafer, forming sawing grooves by sawing at least one of the redistribution pattern and the passivation pattern along individual chip boundaries and by sawing the wafer in a downward direction from a top surface of the wafer by a thickness less than a wafer thickness, filling the sawing grooves with a molding material, bonding solder balls onto the UBM pattern, thinning the wafer based on a backgrinding process, and dividing the wafer into individual chips by sawing the molding material filled in the sawing grooves.

The thinning of the wafer based on the backgrinding process may include entirely removing a region from bottom surfaces of the sawing grooves to a bottom surface of the wafer.

The dividing of the wafer into individual chips by sawing the molding material filled in the sawing grooves may include dividing the wafer into individual chips by sawing only the molding material filled in the sawing grooves, without direct contact between the wafer and a sawing tool.

The filling of the sawing grooves with the molding material may be performed before the bonding of the solder balls onto the UBM pattern, in such a manner that the solder balls are not in contact with the molding material.

The filling of the sawing grooves with the molding material may include entirely covering the molding material on the top surface of the wafer and then cleaning a part of the molding material in such a manner that the top surface of the wafer is exposed and only the sawing grooves are filled with the molding material. The filling of the sawing grooves with the molding material may include entirely covering the molding material on the top surface of the wafer, the redistribution pattern, the passivation pattern, and the UBM pattern and then cleaning a part of the molding material in such a manner that the UBM pattern is exposed and only the sawing grooves are filled with the molding material.

The filling of the sawing grooves with the molding material may include filling the sawing grooves with an epoxy molding compound (EMC).

The semiconductor package may include a wafer-level chip scale package.

BRIEF DESCRIPTION OF THE DRAWINGS

The above and other features and advantages of the present invention will become more apparent by describing in detail embodiments thereof with reference to the attached drawings in which.

DETAILED DESCRIPTION

Hereinafter, the present invention will be described in detail by explaining embodiments of the invention with reference to the attached drawings. The invention may, however, be embodied in many different forms and should not be construed as being limited to the embodiments set forth herein; rather, these embodiments are provided so that this disclosure will be thorough and complete, and will fully convey the concept of the invention to one of ordinary skill in the art. In the drawings, the sizes of elements may be exaggerated or reduced for convenience of explanation.

FIGS. 1A to 1F are sequential cross-sectional views for describing a method of manufacturing a semiconductor package, according to an embodiment of the present invention.

Figure 1A:
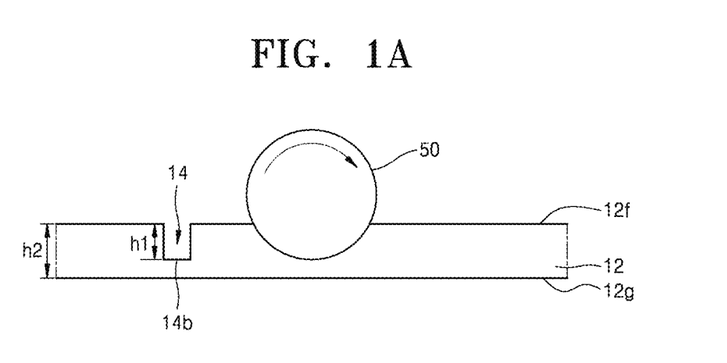
FIGS. 1A to 1F are sequential cross-sectional views for describing a method of manufacturing a semiconductor package, according to an embodiment of the present invention.

Referring to FIG. 1A, sawing grooves 14 are formed by primarily sawing a wafer 12 along individual chip boundaries in a downward direction from a top surface 12$f$ of the wafer 12 by a thickness h1 less than a wafer thickness h2 by using a sawing tool 50. For example, the primary sawing process may be a half sawing process for sawing about a half of the wafer 12.

Figure 1B:
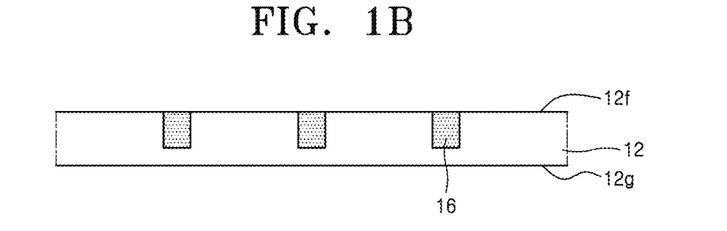

Referring to FIG. 1B, the sawing grooves 14 are filled with a molding material 16. As such, handling of the wafer 12 may be enabled even when a bottom surface of the wafer 12 is removed in a subsequent process, e.g., a backgrinding process, and direct contact between the wafer 12 and the sawing tool 50 may be minimized. The process of filling the sawing grooves 14 with the molding material 16 may include, for example, a process of entirely covering the molding material 16 on the top surface 12$f$ of the wafer 12 and then cleaning a part of the molding material 16 in such a manner that the top surface 12$f$ of the wafer 12 is exposed and only the sawing grooves 14 are filled with the molding material 16. The cleaning process may include a wet or dry cleaning process. Alternatively, the process of filling the sawing grooves 14 with the molding material 16 may include a process of exposing the top surface 12$f$ of the wafer 12 and filling only the sawing grooves 14 with the molding material 16 without entirely covering the molding material 16 on the top surface 12$f$ of the wafer 12. The molding material 16 may include, for example, an epoxy molding compound (EMC).

Figure 1C:
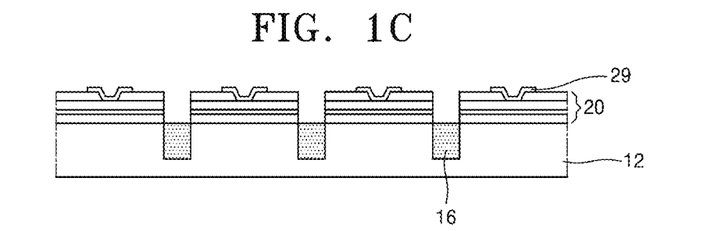
Figure 1D:
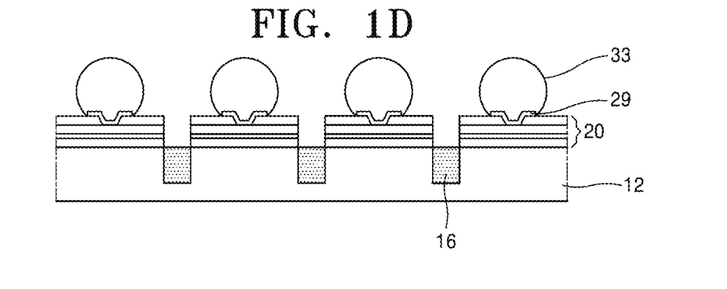

Referring to FIGS. 1C and 1D, redistribution and passivation patterns 20 and an under bump metal (UBM) pattern 29 are formed on the wafer 12. Subsequently, solder balls 33 are bonded onto the UBM pattern 29. A detailed description thereof will be provided below.

Figure 1E:
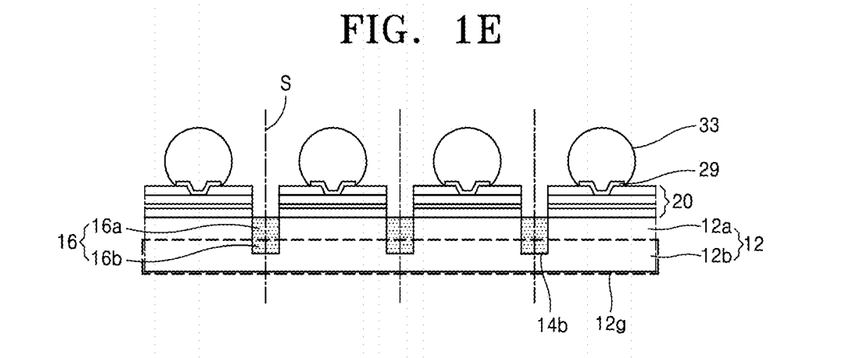
Figure 1F:
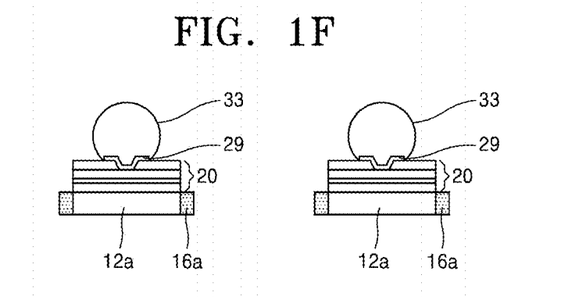

Semiconductor devices (not shown) may be formed on the wafer 12 during or before one of the processes illustrated in FIGS. 1A to 1C. For example, the semiconductor devices may be formed on the wafer 12 before the primary sawing process for forming the sawing grooves 14 in the wafer 12. Alternatively, the semiconductor devices may be formed on the wafer 12 after the sawing grooves 14 are formed and before the redistribution and passivation patterns 20 are formed.

a. Referring to FIG. 1E, the wafer 12 is thinned based on a backgrinding process. The thinning process includes a process of entirely removing a region from bottom surfaces 14$b$ of the sawing grooves 14 to a bottom surface 12$g$ of the wafer 12. That is, a region 12$b$ removed due to the backgrinding process includes at least the region from the bottom surfaces 14$b$ of the sawing grooves 14 to the bottom surface 12$g$ of the wafer 12. Furthermore, in the backgrinding process, lower parts 16$b$ of the molding material 16 filled in the sawing grooves 14 may also be removed. Subsequently, only the molding material 16 remaining in the sawing grooves 14 after the backgrinding process may be secondarily sawed (as indicated by "S") in a downward direction and thus the wafer 12 may be divided into individual chips as illustrated in FIG. 1F.

The above-described method of manufacturing a semiconductor package, according to an embodiment of the present invention, is technically characterized in that direct contact between the wafer 12 and the sawing tool 50 is minimized when the wafer 12 is sawed into individual chips. That is, by half-sawing a base wafer, filling sawing grooves with a molding material, removing an unsawn region of the wafer based on a backgrinding process, and lastly sawing the molding material filled in the sawing grooves, direct contact between the wafer and a sawing tool may be minimized. As such, side wall cracks of a chip may be prevented in a sawing process of a wafer-level chip scale package.

In the above-described method of manufacturing a semiconductor package, according to an embodiment of the present invention, since the process of filling the sawing grooves 14 with the molding material 16 is performed before the process of bonding the solder balls 33 onto the UBM pattern 29, the solder balls 33 may not be in contact with the molding material 16. When the solder balls 33 are bonded onto the UBM pattern 29 and then the sawing grooves 14 are filled with the molding material 16, external force may be applied to the solder balls 33 during the molding process and thus bonding errors of the solder balls 33 may occur, or interfaces between the solder balls 33 and the molding material 16 may be open.

Figure 2A:
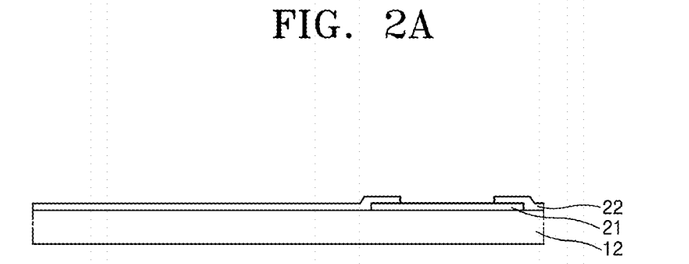
FIGS. 2A to 2P are detailed cross-sectional views for describing a process of forming a redistribution pattern, a passivation pattern, and an under bump metal (UBM) pattern and bonding a solder ball onto the UBM pattern, in the method of manufacturing a semiconductor package, according to an embodiment of the present invention.
Figure 2B:
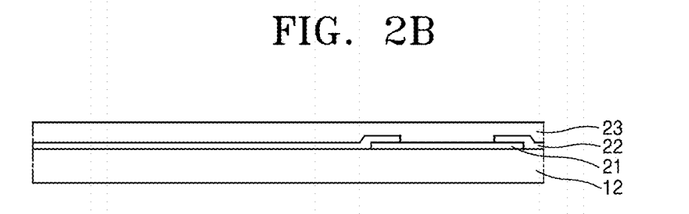
Figure 2C:
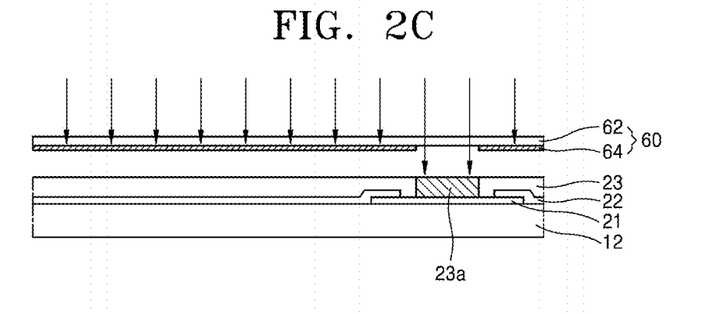
Figure 2D:
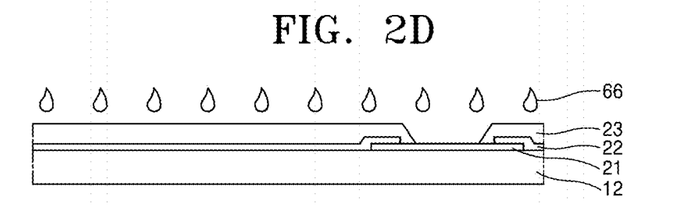
Figure 2E:
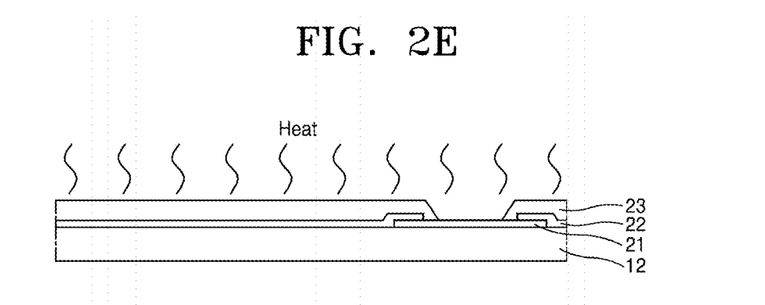
Figure 2F:
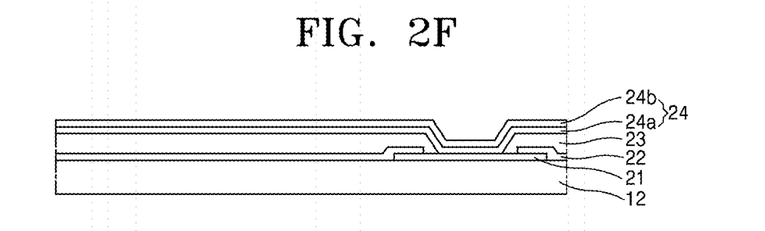
Figure 2G:
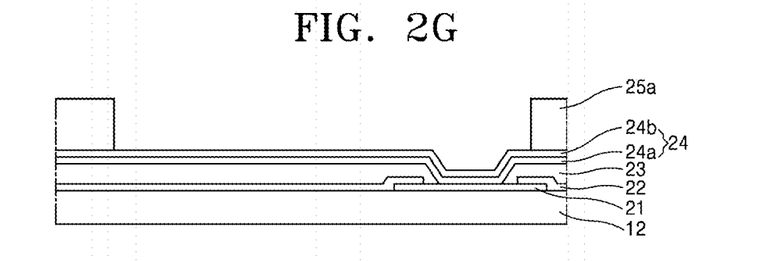
Figure 2H:
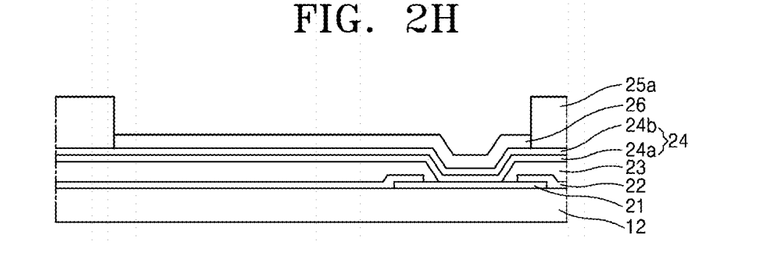
Figure 2I:
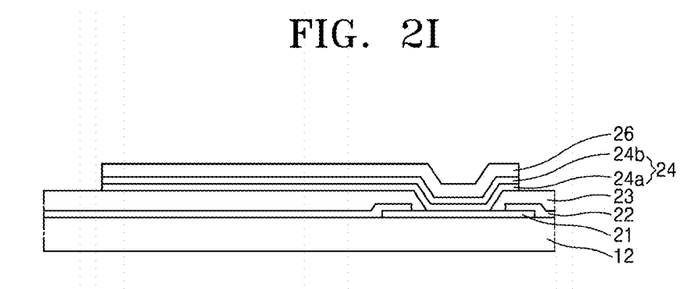
Figure 2J:
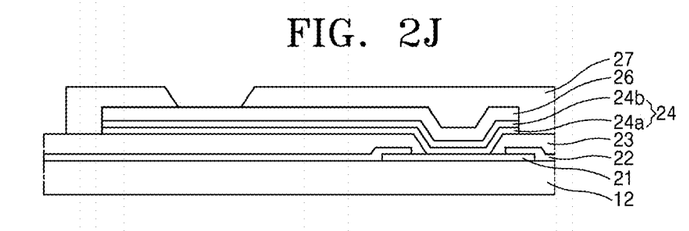
Figure 2K:
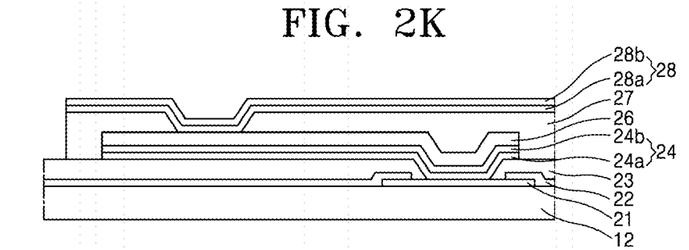
Figure 2L:
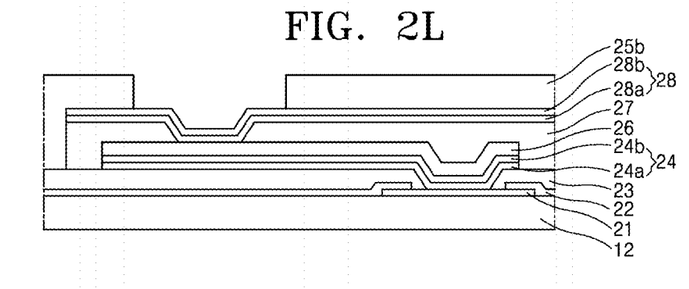
Figure 2M:
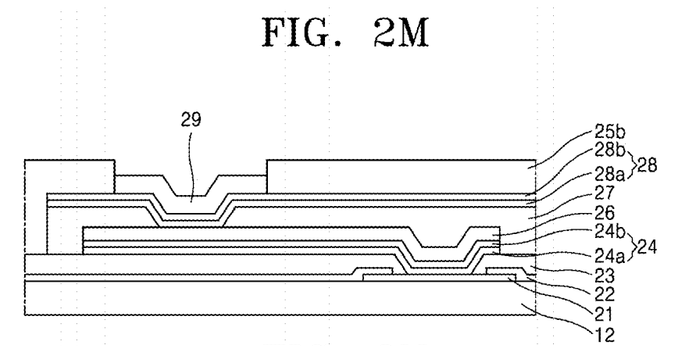
Figure 2N:
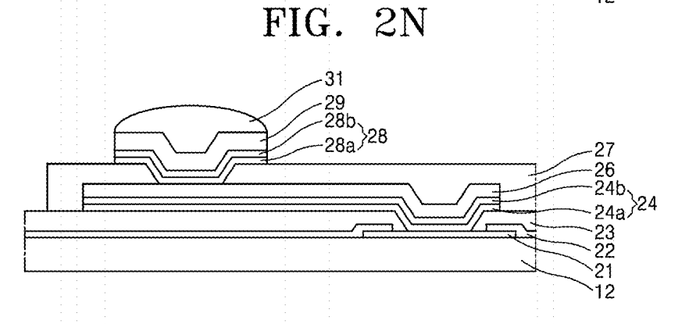
Figure 2O:
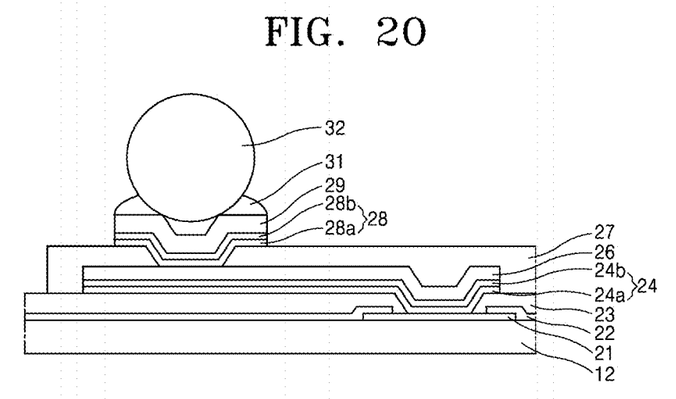
Figure 2P:
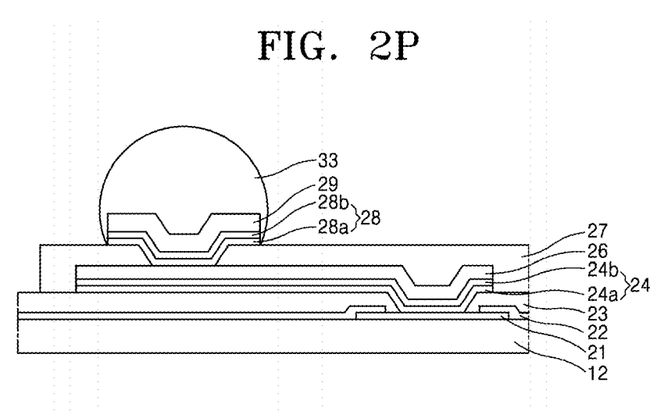

FIGS. 2A to 2P are detailed cross-sectional views for describing a process of forming a redistribution pattern, a passivation pattern, and a UBM pattern and bonding a solder ball onto the UBM pattern, in the method of manufacturing a semiconductor package, according to an embodiment of the present invention.

Referring to FIG. 2A, a conductive electrode pad 21 and an insulating pattern 22 are formed on a wafer 12. Subsequently, referring to FIG. 2B to 2E, sequential processes for forming a first passivation pattern are illustrated.

Referring to FIG. 2B, for example, a first passivation layer 23 is coated. For example, a polybenzoxazole (PBO) layer may be coated as the first passivation layer 23. PBO is a material of the first passivation pattern. The material of the first passivation pattern may be replaced with polyimide (PI), benzocyclobutene (BCB), bismaleimide triazine (BT), phenolic resin, epoxy, silicone, silicon oxide ($SiO_2$), silicon nitride ($Si_3N_4$), or an equivalent thereof.

Referring to FIGS. 2C to 2E, the first passivation layer 23 is selectively exposed using a mask 60, and then a development process for selectively removing the first passivation layer 23 is performed by supplying a developer 66. A first passivation pattern 23 obtained due to the development process is heated and cured. Additionally, a descum process may be performed on the first passivation pattern 23.

Referring to FIG. 2F, a seed layer 24a and a barrier layer 24b for a copper (Cu) plating process are formed. For example, a combination of the seed layer 24a and the barrier layer 24b may include Cu/TiW or Cu/Ti. Referring to FIGS. 2G and 2H, a photoresist pattern 25a is formed on the seed layer 24a and the barrier layer 24b, and then a first plated layer 26 is formed by performing a plating process to form a redistribution pattern. The first plated layer 26 may include, for example, Cu. Referring to FIG. 2I, a redistribution pattern 26 and 24 is obtained by stripping off the photoresist pattern 25a.

Referring to FIG. 2J, for example, a second passivation pattern 27 is formed. The second passivation pattern 27 may be obtained by, for example, forming a second passivation layer, selectively exposing the second passivation layer by using a mask, and then performing a development process and a curing process. For example, a PBO layer may be coated as the second passivation layer. PBO is a material of the second passivation pattern 27. The material of the second passivation pattern 27 may be replaced with PI, BCB, BT, phenolic resin, epoxy, silicone, $SiO_2$, $Si_3N_4$, or an equivalent thereof.

The redistribution and passivation patterns 20 illustrated in FIG. 1 may include the second passivation pattern 27, the redistribution pattern 26 and 24, and the first passivation pattern 23 described above.

Referring to FIG. 2K, a UBM seed layer 28a and a barrier layer 28b for a Cu plating process is formed on the second passivation pattern 27. For example, a combination of the UBM seed layer 28a and the barrier layer 28b may include Cu/TiW or Cu/Ti. Referring to FIGS. 2L and 2M, a photoresist pattern 25b is formed on the UBM seed layer 28a and the barrier layer 28b, and then a second plated layer 29 is formed by performing a plating process to form a UBM pattern. The second plated layer 29 may include, for example, Cu or nickel (Ni). Referring to FIG. 2N, a UBM pattern 28 and 29 is obtained by stripping off the photoresist pattern 25b. Subsequently, a flux 31 is coated on the UBM pattern 28 and 29. Referring to FIGS. 2O and 2P, a solder ball 32 is provided and a reflow process is performed, thereby obtaining a bonded solder ball 33.

FIGS. 3A to 3F are sequential cross-sectional views for describing a method of manufacturing a semiconductor package, according to another embodiment of the present invention.

Figure 3A:
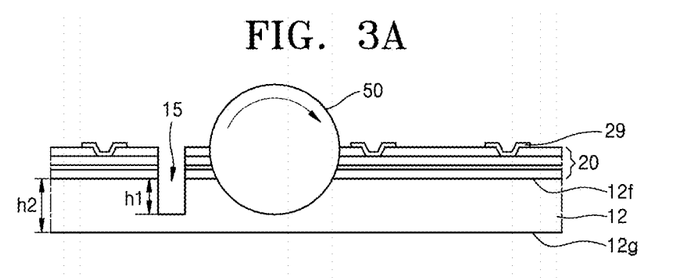
FIGS. 3A to 3F are sequential cross-sectional views for describing a method of manufacturing a semiconductor package, according to another embodiment of the present invention.

Referring to FIG. 3A, redistribution and passivation patterns 20 and a UBM pattern 29 are formed on a wafer 12. The redistribution and passivation patterns 20 illustrated in FIG. 3A may include the second passivation pattern 27, the redistribution pattern 26 and 24, and the first passivation pattern 23 described above in relation to FIGS. 2A to 2P. Subsequently, sawing grooves 15 are formed by sawing at least one of the redistribution and passivation patterns 20 along individual chip boundaries and by primarily sawing a wafer 12 in a downward direction from a top surface 12f of the wafer 12 by a thickness h1 less than a wafer thickness h2 by using a sawing tool 50. For example, the primary sawing process may be a half sawing process for sawing about a half of the wafer 12. The redistribution and passivation patterns 20 and parts of the wafer 12 may be exposed on side walls of the sawing grooves 15.

Figure 3B:
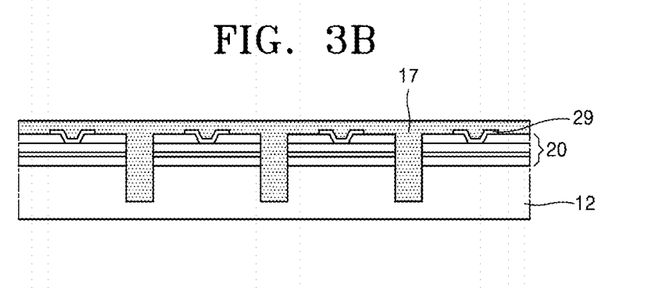
Figure 3C:
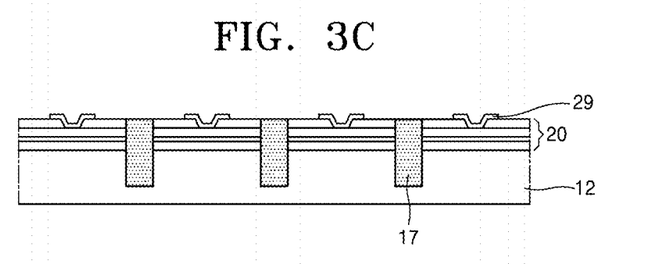

Referring to FIGS. 3B and 3C, the sawing grooves 15 are filled with a molding material 17. As such, handling of the wafer 12 may be enabled even when a bottom surface of the wafer 12 is removed in a subsequent process, e.g., a back-grinding process, and direct contact between the wafer 12 and the sawing tool 50 may be minimized. The process of filling the sawing grooves 15 with the molding material 17 may include, for example, a process of entirely covering the molding material 17 on the top surface 12f of the wafer 12, the redistribution and passivation patterns 20, and the UBM pattern 29 and then cleaning a part of the molding material 17 in such a manner that the UBM pattern 29 is exposed and only the sawing grooves 15 are filled with the molding material 17. The cleaning process may include a wet or dry cleaning process. The molding material 17 may include, for example, an EMC.

Figure 3D:
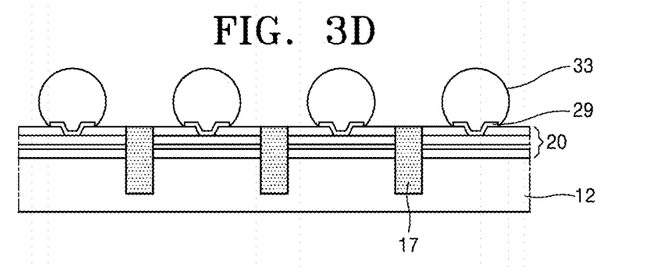

Referring to FIG. 3D, solder balls 33 are bonded onto the UBM pattern 29. The bonding process has been described in detail above in relation to FIGS. 2N to 2P.

Figure 3E:
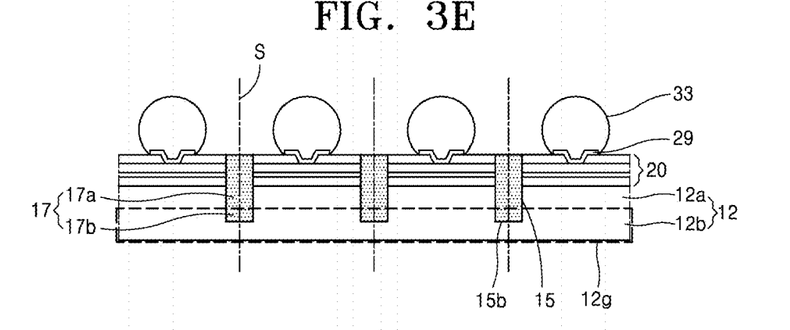
Figure 3F:
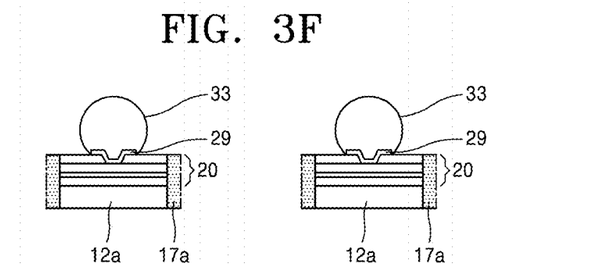

Referring to FIG. 3E, the wafer 12 is thinned based on a backgrinding process. The thinning process includes a process of entirely removing a region from bottom surfaces 15b of the sawing grooves 15 to a bottom surface 12g of the wafer 12. That is, a region 12b removed due to the backgrinding process includes at least the region from the bottom surfaces 15b of the sawing grooves 15 to the bottom surface 12g of the wafer 12. Furthermore, in the backgrinding process, lower parts 17b of the molding material 17 filled in the sawing grooves 15 may also be removed. Subsequently, only the molding material 17 remaining in the sawing grooves 15 after the backgrinding process may be secondarily sawed (as indicated by "S") in a downward direction and thus the wafer 12 may be divided into individual chips as illustrated in FIG. 3F.

The above-described method of manufacturing a semiconductor package, according to an embodiment of the present invention, is technically characterized in that direct contact between the wafer 12 and the sawing tool 50 is minimized when the wafer 12 is sawed into individual chips. That is, by half-sawing a base wafer, filling sawing grooves with a molding material, removing an unsawn region of the wafer based on a backgrinding process, and lastly sawing the molding material filled in the sawing grooves, direct contact between the wafer and a sawing tool may be minimized. As such, side wall cracks of a chip may be prevented in a sawing process of a wafer-level chip scale package.

In the above-described method of manufacturing a semiconductor package, according to an embodiment of the present invention, since the process of filling the sawing grooves 15 with the molding material 17 is performed before the process of bonding the solder balls 33 onto the UBM pattern 29, the solder balls 33 may not be in contact with the molding material 17. When the solder balls 33 are bonded onto the UBM pattern 29 and then the sawing grooves 15 are filled with the molding material 17, external force may be applied to the solder balls 33 during the molding process and thus bonding errors of the solder balls 33 may occur, or interfaces between the solder balls 33 and the molding material 17 may be open.

Figure 4:
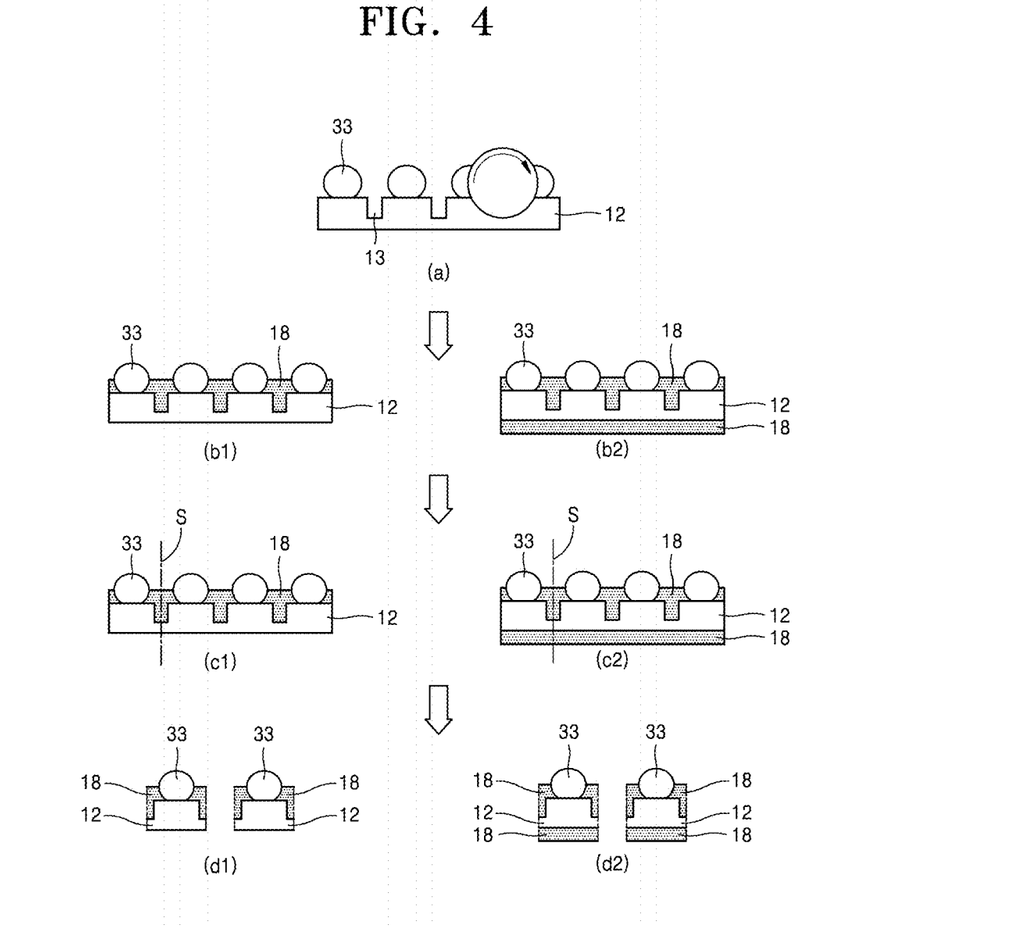
FIG. 4 illustrates sequential cross-sectional views for describing a method of manufacturing a semiconductor package, according to a comparative example of the present invention.

FIG. 4 illustrates sequential cross-sectional views for describing a method of manufacturing a semiconductor package, according to a comparative example of the present invention.

Referring to (a) of FIG. 4, sawing grooves 13 are formed by primarily sawing a wafer 12, onto which solder balls 33 are bonded, along individual chip boundaries in a downward direction from a top surface of the wafer 12 by a thickness less than a wafer thickness.

Figure 5:
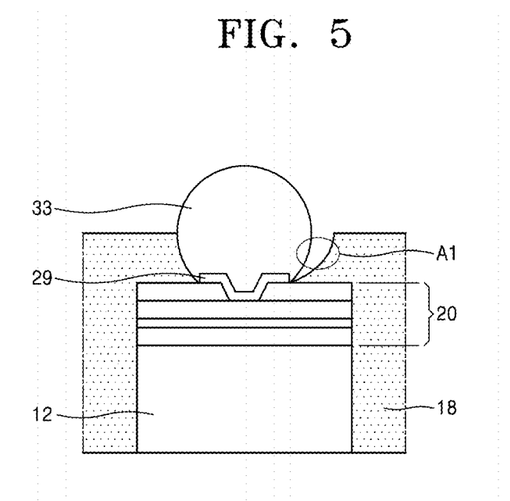
FIG. 5 is a cross-sectional view showing that an interface between a solder ball and a molding material is open in the method of manufacturing a semiconductor package, according to a comparative example of the present invention.

Referring to (b1) or (b2) of FIG. 4, the sawing grooves 13 are filled with a molding material 18. In this process, the molding material 18 may be filled not only in the sawing grooves 13 but also on at least parts of the solder balls 33. In this case, external force may be applied to the solder balls 33 during the molding process and thus bonding errors may occur between the solder balls 33 and a UBM pattern 29, or interfaces between the solder balls 33 and the molding material 18 may be open (as indicated by "A1" in FIG. 5).

Referring to (c1) or (c2) of FIG. 4, the molding material 18 and the wafer 12 may be secondarily sawed (as indicated by "S") along the individual chip boundaries and thus the wafer 12 may be divided into individual chips as illustrated in (d1) or (d2) of FIG. 4. In the secondary sawing process, since a sawing tool directly contacts the wafer 12, side wall cracks of a chip may occur in a sawing process of a wafer-level chip scale package (see FIGS. 6A to 6C).

Figure 6A:
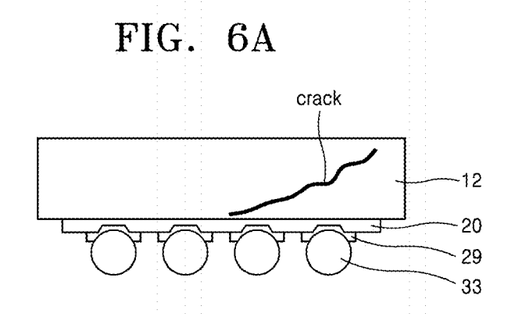
FIGS. 6A to 6C are a cross-sectional view and microscopic images showing that cracks occur in a side wall of a chip in the method of manufacturing a semiconductor package, according to a comparative example of the present invention.
Figure 6B:
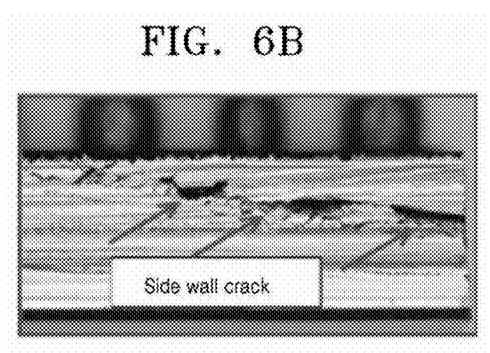
Figure 6C:
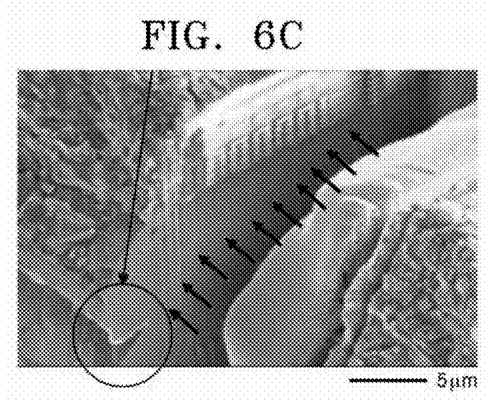

Referring to FIG. 6A, a side wall of a chip of a wafer-level chip scale package is a side wall of the wafer 12, and a crack occurring in the side wall of the wafer 12 is schematically illustrated. FIGS. 6B and 6C are microscopic images of cracks caused in a sawing process.

In the method of manufacturing a semiconductor package, according to a comparative example of the present invention, although sawing grooves are filled with a molding material, since a backgrinding process for removing a region from bottom surfaces of the sawing grooves to a bottom surface of a wafer is not performed, a sawing tool directly contacts the wafer in a secondary sawing process and thus cracks occur. On the contrary, according to the present invention, since sawing grooves formed based on half sawing are filled with a molding material and then a backgrinding process and a secondary sawing process are performed, as described above, handling of a wafer may be continuously enabled and side wall cracks of a chip may be prevented.

As described above, according to an embodiment of the present invention, a method of manufacturing a semiconductor package, the method being capable of preventing side wall cracks of a chip in a sawing process of a wafer-level chip scale package may be implemented. However, the scope of the present invention is not limited to the above effect.

While the present invention has been particularly shown and described with reference to embodiments thereof, it will be understood by one of ordinary skill in the art that various changes in form and details may be made therein without departing from the scope of the present invention as defined by the following claims.

What is claimed is:

1. A method of manufacturing a semiconductor package, the method comprising:
   forming sawing grooves by sawing a wafer along individual chip boundaries in a downward direction from a first surface of the wafer by a thickness less than a wafer thickness;
   filling the sawing grooves with a molding material;
   forming a redistribution pattern, a passivation pattern, and an under bump metal (UBM) pattern on the first surface of the wafer, except for on the molding material, after the step of filling the sawing grooves;
   bonding solder balls onto the UBM pattern;
   thinning the wafer based on a backgrinding process, the backgrinding process being performed on a second surface of the wafer and the second surface being opposite to the first surface; and
   dividing the wafer into individual chips by sawing the molding material filled in the sawing grooves, in a downward direction.

2. The method of claim 1, wherein the thinning of the wafer based on the backgrinding process comprises entirely removing a region from bottom surfaces of the sawing grooves to a bottom surface of the wafer.

3. The method of claim 2, wherein the dividing of the wafer into individual chips by sawing the molding material filled in the sawing grooves comprises dividing the wafer into individual chips by sawing only the molding material filled in the sawing grooves, without direct contact between the wafer and a sawing tool.

4. The method of claim 1, wherein the filling of the sawing grooves with the molding material is performed before the bonding of the solder balls onto the UBM pattern, in such a manner that the solder balls are not in contact with the molding material.

5. The method of claim 1, wherein the filling of the sawing grooves with the molding material comprises entirely covering the molding material on the top surface of the wafer and then cleaning a part of the molding material in such a manner that the top surface of the wafer is exposed and only the sawing grooves are filled with the molding material.

6. The method of claim 5, wherein the filling of the sawing grooves with the molding material comprises filling the sawing grooves with an epoxy molding compound (EMC).

7. The method of claim 1, wherein the semiconductor package comprises a wafer-level chip scale package.

8. A method of manufacturing a semiconductor package, the method comprising:
   forming a redistribution pattern, a passivation pattern, and an under bump metal (UBM) pattern on a first surface of a wafer;
   forming sawing grooves by sawing at least one of the redistribution pattern and the passivation pattern along individual chip boundaries and by sawing the wafer in a downward direction from the first surface of the wafer by a thickness less than a wafer thickness, after the step of forming a redistribution pattern, a passivation pattern, and an under bump metal (UBM) pattern;
   filling the sawing grooves with a molding material;
   bonding solder balls onto the UBM pattern;
   thinning the wafer based on a backgrinding process, the backgrinding process being performed on a second surface of the wafer and the second surface being opposite to the first surface; and
   dividing the wafer into individual chips by sawing the molding material filled in the sawing grooves.

9. The method of claim 8, wherein the filling of the sawing grooves with the molding material comprises entirely covering the molding material on the top surface of the wafer, the redistribution pattern, the passivation pattern, and the UBM pattern and then cleaning a part of the molding material in such a manner that the UBM pattern is exposed and only the sawing grooves are filled with the molding material.

10. The method of claim 9, wherein the filling of the sawing grooves with the molding material comprises filling the sawing grooves with an epoxy molding compound (EMC).

11. The method of claim 8, wherein the thinning of the wafer based on the backgrinding process comprises entirely removing a region from bottom surfaces of the sawing grooves to a bottom surface of the wafer.

12. The method of claim 11, wherein the dividing of the wafer into individual chips by sawing the molding material filled in the sawing grooves comprises dividing the wafer into individual chips by sawing only the molding material filled in the sawing grooves, without direct contact between the wafer and a sawing tool.

13. The method of claim 8, wherein the filling of the sawing grooves with the molding material is performed before the bonding of the solder balls onto the UBM pattern, in such a manner that the solder balls are not in contact with the molding material.

14. The method of claim 8, wherein the semiconductor package comprises a wafer-level chip scale package.

\* \* \* \* \*